United States Patent
Siriani et al.

(10) Patent No.: US 10,734,788 B2
(45) Date of Patent: Aug. 4, 2020

(54) QUANTUM DOT LASERS INTEGRATED ON SILICON SUBMOUNT WITH MECHANICAL FEATURES AND THROUGH-SILICON VIAS

(71) Applicant: Cisco Technology, Inc., San Jose, CA (US)

(72) Inventors: Dominic F. Siriani, Allentown, PA (US); Sean P. Anderson, Macungie, PA (US); Vipulkumar Patel, Breinigsville, PA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 15/910,345

(22) Filed: Mar. 2, 2018

(65) Prior Publication Data

US 2019/0273364 A1  Sep. 5, 2019

(51) Int. Cl.

| | |
|---|---|
| *H01S 5/343* | (2006.01) |
| *H01S 5/02* | (2006.01) |
| *H01L 21/68* | (2006.01) |
| *H01S 5/34* | (2006.01) |
| *H01L 21/02* | (2006.01) |
| *H01S 5/022* | (2006.01) |
| *B82Y 20/00* | (2011.01) |
| *H01S 5/042* | (2006.01) |
| *H01S 5/125* | (2006.01) |
| *H01S 5/22* | (2006.01) |
| *H01S 5/10* | (2006.01) |

(52) U.S. Cl.
CPC ........ *H01S 5/343* (2013.01); *H01L 21/02002* (2013.01); *H01L 21/68* (2013.01); *H01S 5/021* (2013.01); *H01S 5/0203* (2013.01); *H01S 5/0215* (2013.01); *H01S 5/02276* (2013.01); *H01S 5/3412* (2013.01); *B82Y 20/00* (2013.01); *H01S 5/02268* (2013.01); *H01S 5/04257* (2019.08); *H01S 5/1032* (2013.01); *H01S 5/125* (2013.01); *H01S 5/22* (2013.01); *H01S 2301/176* (2013.01)

(58) Field of Classification Search
CPC ........ H01S 5/00; H01S 5/0216; H01S 5/0282; H01S 5/0215; H01S 5/0224; H01S 5/0206; H01L 21/68
See application file for complete search history.

(56) References Cited

U.S. PATENT DOCUMENTS

| | | |
|---|---|---|
| 5,374,564 A | 12/1994 | Bruel |
| 8,916,769 B2 | 12/2014 | Hovel |
| 2003/0213950 A1 | 11/2003 | Hwang |
| 2004/0247236 A1* | 12/2004 | Yoshimura ......... G02B 6/12002 385/16 |

(Continued)

OTHER PUBLICATIONS

Koch et al., "Hetrogeneously Integrated Lasers on Silicon," Proceedings vol. 9002, Novel in-Plane Semicondutor Lasers XIII; 9002OU, Feb. 27, 2014, [Accessed Online Mar. 1, 2018] https://www.spiedigitallibrary.org/conference-proceedings-of-spie/9002/90020U/Heterogeneously-integrated-lasers-on-silicon/10.1117/12.2042023.short?SSO=1.

(Continued)

*Primary Examiner* — Tuan N Nguyen
(74) *Attorney, Agent, or Firm* — Patterson + Sheridan, LLP

(57) ABSTRACT

A wafer comprising: a silicon substrate; a base layer of a predetermined thickness of a III-V semiconductor material bonded with the silicon substrate; and at least one layer grown on the base layer to form a plurality of quantum dot lasers.

9 Claims, 16 Drawing Sheets

(56) References Cited

U.S. PATENT DOCUMENTS

| | | |
|---|---|---|
| 2009/0086170 A1 | 4/2009 | El-Ghoroury et al. |
| 2010/0013053 A1 | 1/2010 | Nakayama et al. |
| 2011/0198638 A1 | 8/2011 | Wang |
| 2012/0063717 A1 | 3/2012 | Grenouillet et al. |
| 2015/0010031 A1 | 1/2015 | Makino et al. |
| 2015/0177458 A1* | 6/2015 | Bowers .................. G02B 6/131 385/14 |
| 2015/0348906 A1 | 12/2015 | Park et al. |
| 2016/0202592 A1 | 7/2016 | Hollis et al. |
| 2016/0334574 A1* | 11/2016 | Czornomaz ........ G02B 6/12004 |
| 2017/0207600 A1 | 7/2017 | Klamkin et al. |
| 2018/0182508 A1 | 6/2018 | Tanaka et al. |
| 2018/0287332 A1 | 10/2018 | Preble et al. |
| 2019/0018279 A1 | 1/2019 | Wang et al. |
| 2019/0067900 A1 | 2/2019 | Bhattacharya et al. |
| 2019/0115459 A1 | 4/2019 | Kim |

OTHER PUBLICATIONS

Kurczveil et al., "Robust hybrid quantum dot laser for integrated silicon photonics," OSA Publishing, Issue 14, pp. 16167-16174, 2016, [Accessed Online Mar. 1, 2018] https://www.osapublishing.org/oe/abstract.cfm?uri=oe-24-14-16167&origin=search.

Chen et al., Electrically pumped continuous-wave 1.3 μm InAs/GaAs quantum dot lasers monolithically grown on on-axis Si (001) substrates, OSA Publishing, Optic Express, vol. 25, Issue 5, pp. 4632-4639, 2017, [Accessed Online Mar. 1, 2018] https://www.osapublishing.org/oe/fulltext.cfm?uri=oe-25/5/4632&id=360284.

Shinji Matsuo, "High Performance Lasers on InP-SOI Platform," OSA Publishing, Conference Papers, OFC, 2017, M3B, p. M3B.1, [Accessed Online Mar. 1, 2018] [Abstract Only] https://www.osapublishing.org/abstract.cfm?uri=ofc-2017-M3B.1&origin=search.

International Search Report and Written Opinion for Application No. PCT/US2019-020381 dated Jun. 11, 2019.

* cited by examiner

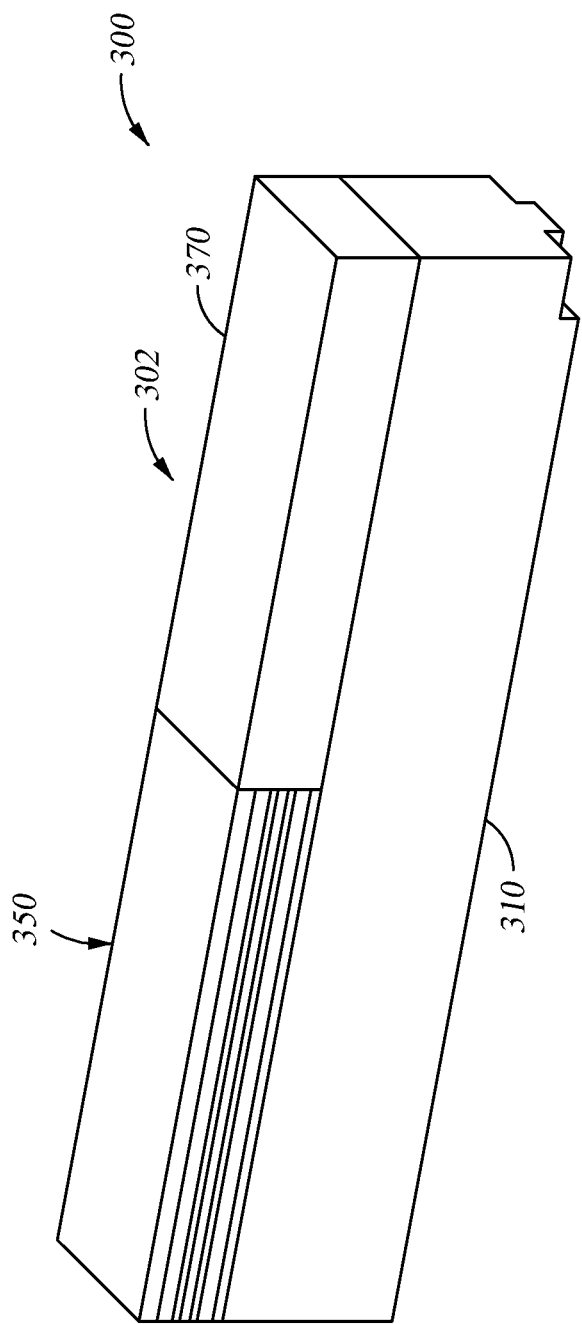
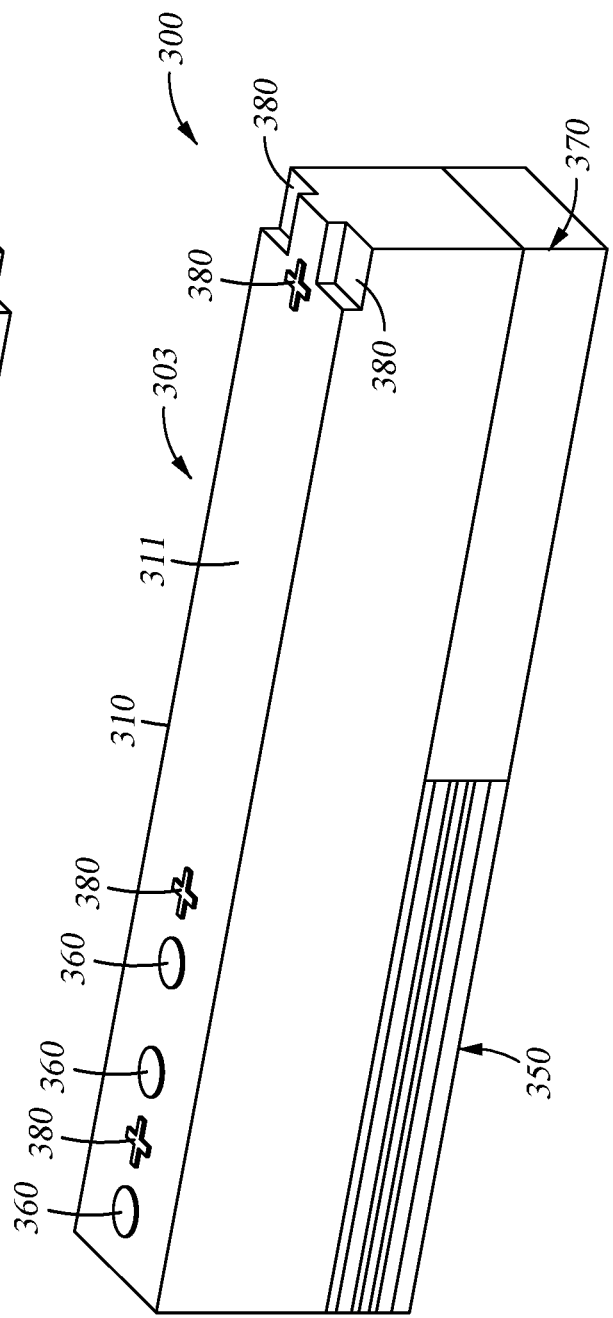

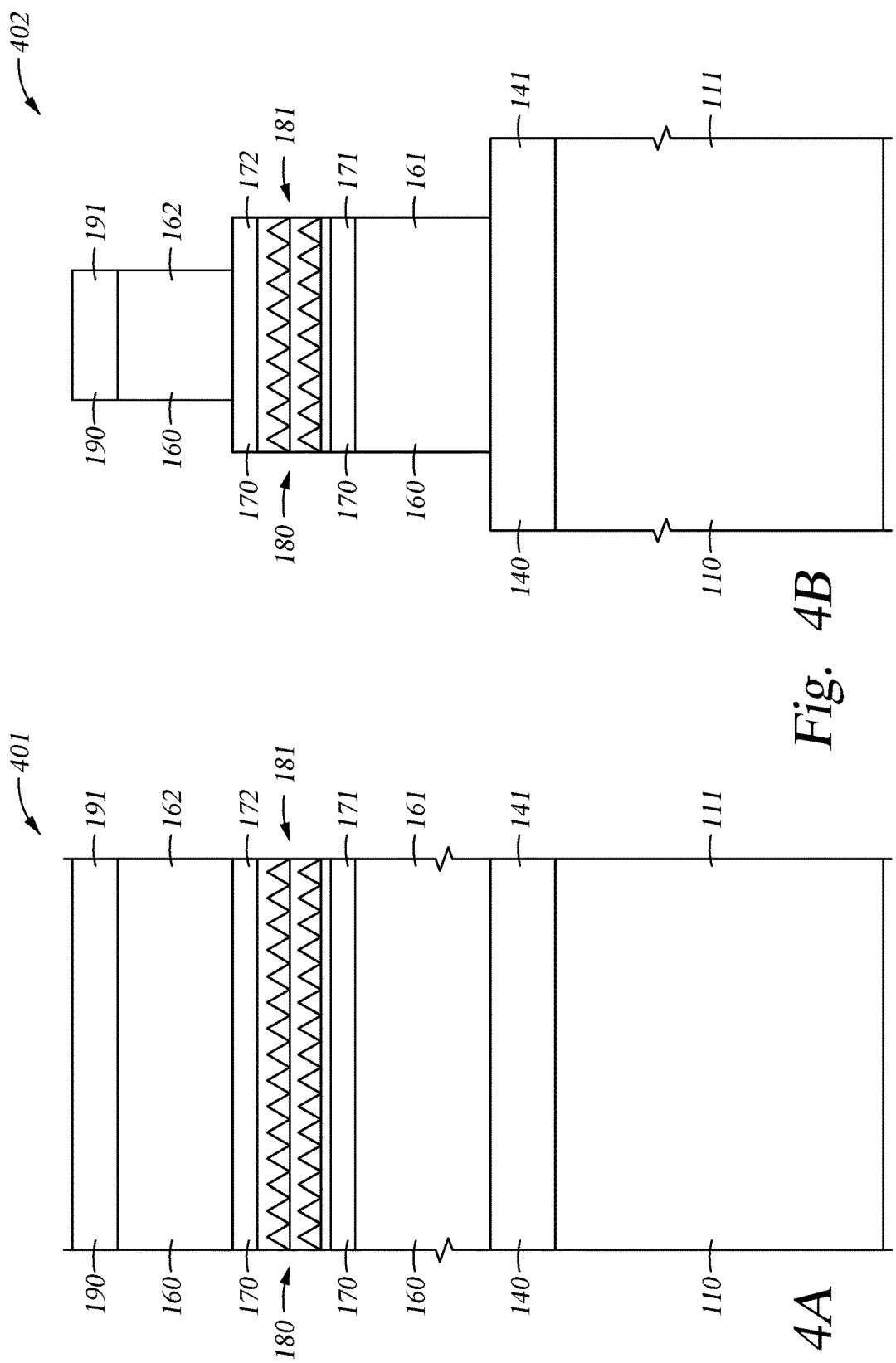

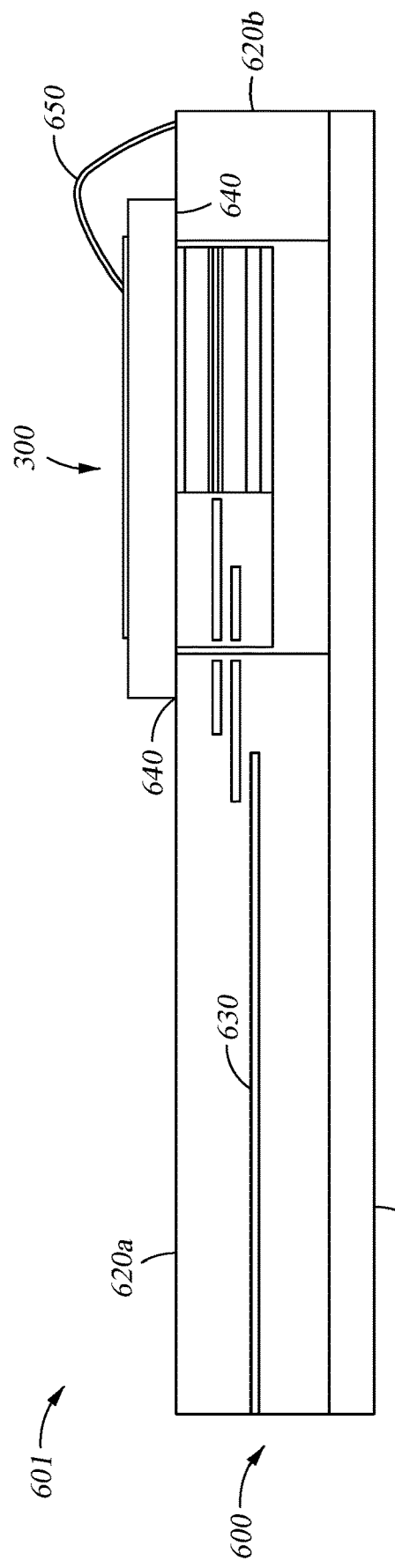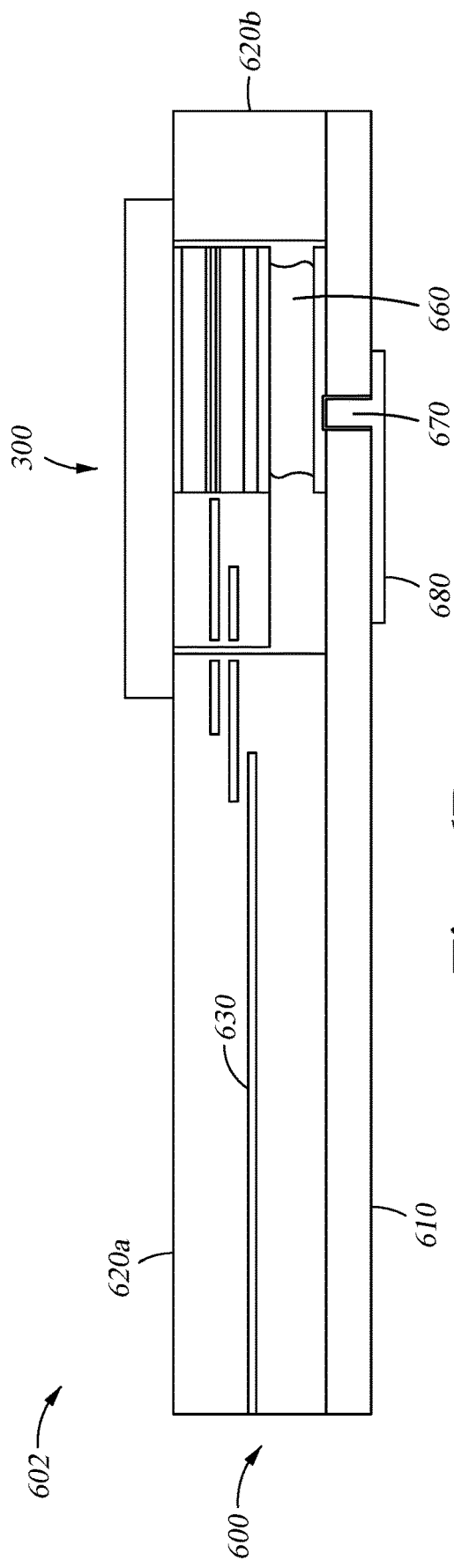
Fig. 6A
Fig. 6B

QUANTUM DOT LASERS INTEGRATED ON SILICON SUBMOUNT WITH MECHANICAL FEATURES AND THROUGH-SILICON VIAS

TECHNICAL FIELD

Embodiments presented in this disclosure generally relate to quantum dot lasers and the fabrication thereof.

BACKGROUND

The cost of production and the physical properties of lasers are directly influenced by the materials and methods used in producing those lasers. The choices made in the production methods and construction materials not only affect the yield for a given batch of lasers, but affect the size that batches may be. As a result, lasers are often produced on specialized equipment and in smaller batches than other electrical or optical components. Additionally, due to material differences in the laser from the other components, special techniques and materials are often used to integrate the lasers with other electrical or optical components to create a final assembly, which the other components do not require to integrate with one another, further adding to the costs of production.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIGS. 3A-C illustrate various views of an individual die of a Quantum Dot laser produced according to the present disclosure.

FIGS. 4A-D illustrate various frontal cut-away views to highlight the different layers and strata of a Quantum Dot laser in various stages of fabrication.

FIGS. 6A-C illustrate various mounting schemes for a Quantum Dot laser constructed according to the present disclosure with a larger photonic integrated circuit.

To facilitate understanding, identical reference numerals have been used, where possible, to designate identical elements that are common to the figures. It is contemplated that elements disclosed in one embodiment may be beneficially utilized on other embodiments without specific recitation.

DESCRIPTION OF EXAMPLE EMBODIMENTS

Overview

Figure 1A:
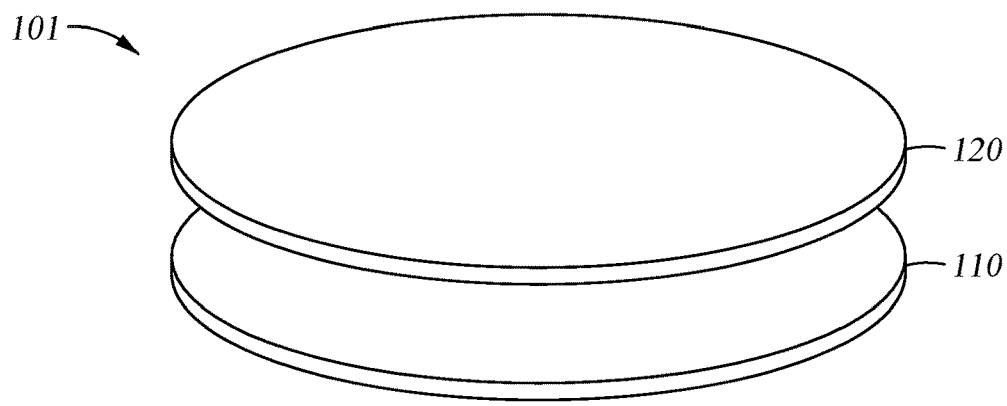
FIGS. 1A-G illustrate various views of the fabrication of Quantum Dot laser assemblies using a thin film of III-V semiconductor material bonded with a Silicon substrate.
Figure 1B:
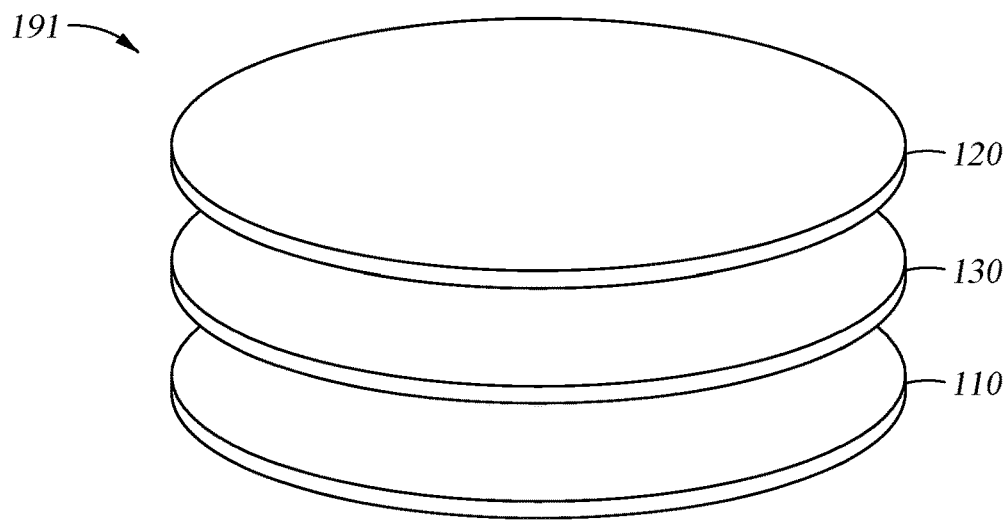

One embodiment presented in this disclosure provides a method comprising bonding a sheet of a III-V semiconductor material with a first side of a silicon wafer, removing excess III-V semiconductor material bonded with the silicon wafer to leave a base layer of a predetermined thickness of the III-V semiconductor material bonded with the silicon wafer, epitaxially growing at least one layer on the base layer, the at least one layer comprising a quantum dot layer arranged with a predetermined height relative to the first side of the silicon wafer, and dicing the silicon wafer to produce a plurality of quantum dot lasers.

In another embodiment presented in this disclosure provides a wafer comprising a silicon substrate, a base layer of a predetermined thickness of a III-V semiconductor material bonded with the silicon substrate, and at least one layer grown on the base layer to form a plurality of quantum dot lasers.

A further embodiment presented in this disclosure provides a laser comprising a silicon substrate having an upper side and an underside opposite to the upper side, a III-V semiconductor material layer, bonded with the upper side of the silicon substrate, a quantum dot layer included in one or more layers grown from the III-V semiconductor material layer at a predetermined height relative to the upper side of the silicon substrate, and wherein the underside of the silicon substrate includes a plurality of assembly features defined on the silicon substrate as a wafer-level feature.

Example Embodiments

Silicon (Si) photonic applications often use Quantum Well (QW) based lasers that are based on small-size (e.g., 5 cm diameter and less) indium phosphide (InP) substrates. These InP-based QW lasers often have limited operating temperature ranges, greater back-reflection sensitivity, and limited gain bandwidth when compared to Quantum Dot (QD) lasers. Additionally, InP substrates tend to be more brittle and are less thermally conductive than Si substrates, leading to the use of smaller-sized substrates and worse heat-sinking performance for components that are InP-based. Additionally, the differences in coefficients of thermal expansion between InP and Si makes strain management during production and later use challenging.

Most efforts to date to integrate QW or QD lasers onto Si Photonic platforms bond lasers grown on InP or Gallium-Arsenide (GaAs) substrates to a Si substrate. Efforts to directly grow QD lasers onto Si photonics platforms have not been cost effective, due in part to the use of larger wafers (e.g., 200-300 mm) having a small ratio of III-V semiconductor material to wafer area, and laser yield losses also resulting in the loss of Si photonic dies.

Instead, as is discussed herein in greater detail in regard to the Figures, growing QD lasers on a thin film of III-V semiconductor material bonded with a Si substrate, provides lasers that have superior physical properties, greater ease of manufacture, and/or greater production yields than InP-based QW lasers or QW/QD lasers grown from Si substrates.

FIGS. 1A-F illustrate various views of an exemplary fabrication process of QD laser assemblies using a thin film of III-V semiconductor material bonded with a Si substrate, according to one or more embodiments herein. FIG. 1A illustrates a first state of fabrication 101, in which a wafer 110 is bonded with a sheet 120 that is made of a III-V semiconductor material. As is shown in FIG. 1A, the sheet 120 may be bonded directly to the wafer 110, however, in an optional first state of fabrication 191 shown in FIG. 1B, an intermediate layer 130 is disposed between the wafer 110 and the sheet 120 and operates to bond the wafer 110 and the sheet 120 together.

The wafer 110 comprises a Si substrate from which various optical and electrical components may be grown or eutectically bonded. In some embodiments, the Si substrate of the wafer 110 is a bulk Si substrate in which one or more features or materials for the optically active device to be produced (e.g., a laser, detector, modulator, absorber) have been pre-processed. In various embodiments, the diameter of the wafer 110 may range between about 50 millimeters (mm) and about 200 mm, and its thickness may range between about 0.3 mm and about 1 mm, but the dimensions of the wafer 110 may be changed to account for new diameters and thicknesses desired in Si fabrication industries.

The sheet 120 may be bonded directly (per FIGS. 1A and 1C) with the wafer 110, or may be bonded indirectly (per FIGS. 1B and 1D) with the wafer 110. The diameter of the sheet 120 may be based on the diameter of the wafer 110 (e.g., within +/−5% of the wafer diameter), but the thickness of the sheet 120 may vary independently of the thickness of the wafer 110 (i.e., either thicker or thinner than the wafer 110). In some embodiments, the diameter of the sheet 120 is independent from the diameter of the wafer 110; for example, several small sheets 120 may be bonded with a wafer 110 having a much larger diameter (e.g., several 50 mm sheets 120 bonded with a 300 mm wafer 110). Various methods of bonding the sheet 120 with the wafer 110 may be used, which will be familiar to those of ordinary skill in the art, and that may differ based on the particular III-V semiconductor material that comprises the sheet 120 and whether an intermediate layer 130 is used. Various III-V semiconductor materials are used in different embodiments to comprise the sheet 120, which include a material selected from the Boron group (i.e., a group III material: Boron, Aluminum, Gallium, Indium, Thallium) and a material selected from the Nitrogen group (i.e., a group V material: Nitrogen, Phosphorus, Arsenic, Antimony, Bismuth), such as, for example: Boron-Nitride (BN), Gallium-Nitride (GaN), Gallium-Arsenide (GaAs), and Indium-Phosphide (InP).

In some embodiments, the intermediate layer 130 (when used) may be sized with a diameter that substantially matches (e.g., +/−1%) the diameter of the wafer 110. In some embodiments, the thickness of the intermediate layer 130 may vary between about 1 nanometers (nm) and about 1000 nm. Various materials for an intermediate layer 130 may be used in different embodiments, such as, for example, a dielectric such as silicon dioxide ($SiO_2$), a polymer, a metal, or a semiconductor. One of ordinary skill in the art will be familiar with suitable materials that may be used as an intermediate layer 130.

Additionally, any of the III-V semiconductor material, the material of the intermediate layer 130, and the wafer 110 may be doped with various other materials to affect their physical and/or electrical properties. For example, Si, C, Zn, Ge, Sn, Cd, S, Se, Te, Be, Mg, and other impurities may be used to dope the III-V semiconductor material for use as an electron emitter or electron collector when used in a semiconductor component. The III-V semiconductor material used in the sheet 120 may be doped prior to bonding with the wafer 110 or after bonding with the wafer 110 in various embodiments. In another example, B and P may be used as dopants for the wafer 110.

Figure 1C:
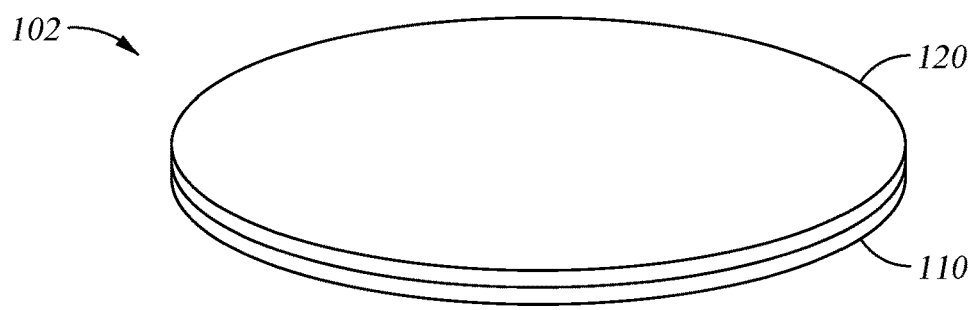
Figure 1D:
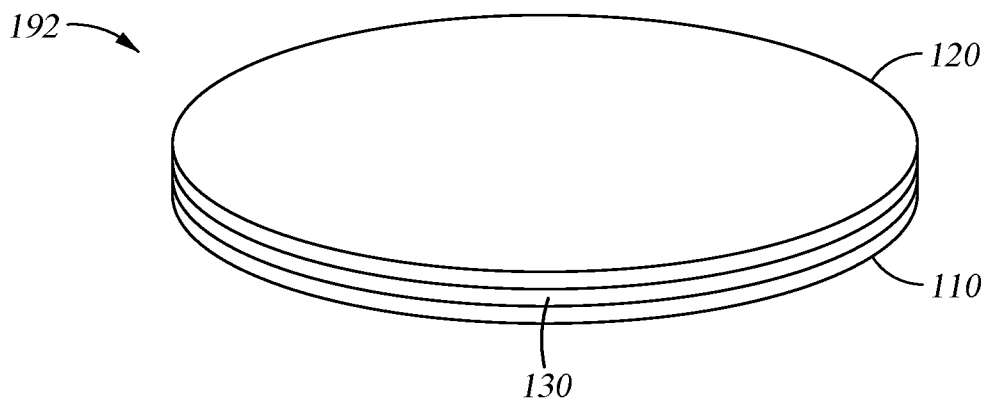

FIG. 1C illustrates a second state of fabrication 102 advancing from the first state of fabrication 101, in which the sheet 120 has been directly bonded to the wafer 110. FIG. 1D illustrates an optional second state of fabrication 192 advancing from the optional first state of fabrication 101, in which the sheet 120 has been bonded indirectly with the wafer 110 via the intermediate layer 130.

Figure 1E:
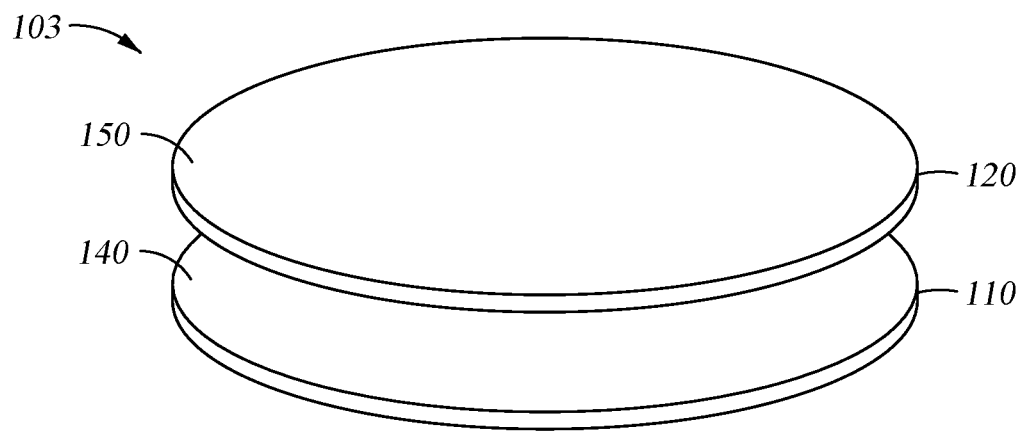

FIG. 1E illustrates a third state of fabrication 103, advancing from either the second state of fabrication 102 or the optional second state of fabrication 192, in which the sheet 120 is separated from the wafer 110 to produce a base layer 140 of a thin film of the III-V semiconductor material that is bonded with the wafer 110 and excess material 150 that has been removed from the wafer 110. The base layer 140 comprises a predetermined thickness of the selected III-V semiconductor material, such as, for example, a base layer 140 that is between about 10 nm and about 1000 nm thick. In embodiments that use an intermediate layer 130, the intermediate layer 130 is included within the base layer 140. The excess material 150 comprises the material of the sheet 120 that is not left bonded with the wafer 110 once separated. In different embodiments, the excess material 150 of the sheet 120 is removed from the wafer 110 using chemical means, mechanical means, or a combination thereof, such as, for example, the SMART CUT® process described in U.S. Pat. No. 5,374,564. Once the excess material 150 has been separated from the wafer 110, it may then be re-processed and recycled to produce a new sheet 120 that is then used to bond with additional wafers 110.

Figure 1F:
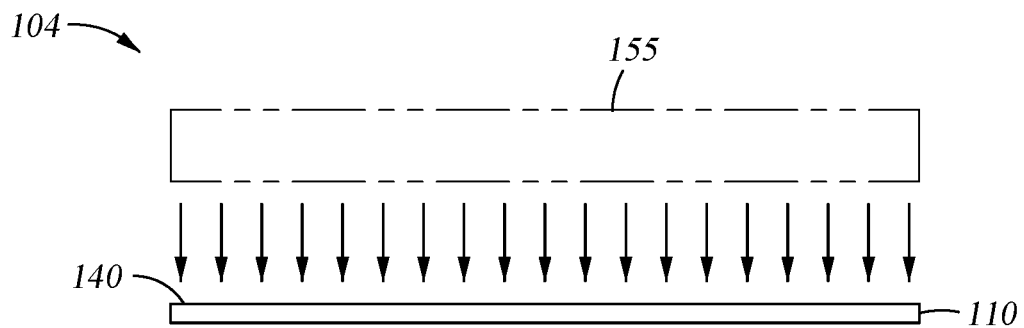

FIG. 1F illustrates a fourth state of fabrication 104 advancing from the third state of fabrication 103, in which epitaxial growth processes 155 are applied to the base layer 140. In various embodiments, various additional layers of a QD laser are grown from the base layer 140 via epitaxial growth processes 155 known to a person of ordinary skill in the art. Some non-limiting examples of epitaxial growth processes 155 include Chemical Vapor Deposition (CVD), Metal-Organic CVD (MOCVD), Molecular Beam Epitaxy (MBE), Vapor-Phase Epitaxy (VPE), Liquid-Phase Epitaxy (LPE), Solid-Phase Epitaxy (SPE), Hydride Vapor Phase Epitaxy, etc.

Figure 1G:
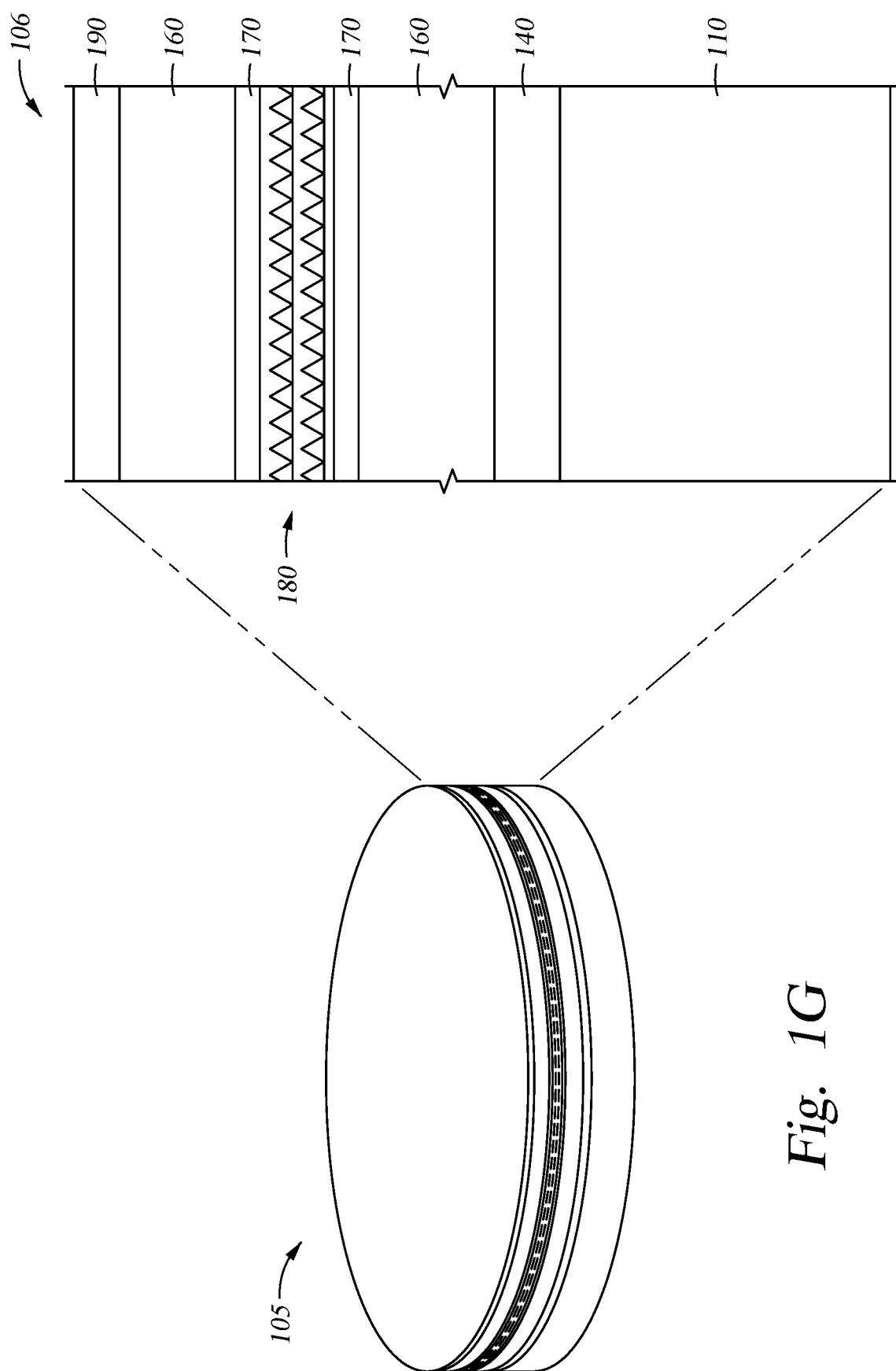

FIG. 1G illustrates a fifth state of fabrication 105 advancing from the fourth state of fabrication 104, in which several layers grown from the base layer 140 are shown as strata in cross-section. As will be appreciated, the individual and relative heights/thicknesses of the strata and their associated layers shown in the fifth state of fabrication 105 are provided as non-limiting examples; one of ordinary skill in the art will be able to adjust the heights/thicknesses of the layers to fabricate a QD laser to meet the needs of individual applications. As shown in detail 106, a matrix layer 160, a waveguide layer 170, a quantum dot layer 180, and a contact layer 190 have been grown from the base layer 140. In cross section, the wafer 110 defines a silicon stratum 111, the base layer 140 defines a first III-V semiconductor material stratum 141, the matrix layer 160 defines a first cladding stratum 161 and a second cladding stratum 162, the waveguide layer 170 defines a first waveguide stratum 171 and a second waveguide stratum 172, the quantum dot layer 180 defines a quantum dot stratum 181, and the contact layer 190 defines a second III-V semiconductor material stratum 191.

The matrix layer 160, also referred to as a cladding layer, comprises a lattice-matched material to the III-V semiconductor material that is used for the base layer 140. For example, AlGaAs may be used for the matrix layer 160 when GaAs is used for the base layer 140. Other example lattice-matched materials include, but are not limited to: InGaP with GaAs and AlGaInAs, AlInAs, InGaAs, GaAsSb, InGaAsP with InP. One of ordinary skill in the art will be able to select a lattice-matched material for use with the selected III-V semiconductor material for the base layer 140.

In some embodiments, the matrix layer 160 comprises one layer epitaxially grown around the waveguide layer 170 and the quantum dot layer 180. In other embodiments, the matrix layer 160 comprises two layers; one grown from the base layer 140 and one grown from the second waveguide stratum 172 of the waveguide layer 170.

The waveguide layer 170 comprises a III-V semiconductor material that is grown to surround the quantum dot layer 180 and provides a structured gain medium in which the light produced by the quantum dot layer 180 is amplified and directed outward from the quantum dot layer 180 in one or more directions. In several embodiments, the III-V semiconductor material that comprises the waveguide layer 170 is the same as the III-V semiconductor material of the base layer 140, but may also be made of different III-V semiconductor materials (e.g., AlGaAs when GaAs used for the base layer 140) or doped with different (or no) dopants than the base layer 140. In some embodiments, the waveguide layer 170 comprises one layer epitaxially grown around the quantum dot layer 180. In other embodiments, the waveguide layer 170 comprises two layers; one grown from the first stratum 161 of the matrix layer 160 and one grown from the quantum dot layer 180.

The quantum dot layer 180 includes a plurality of quantum dots that, when stimulated by an applied electrical current, emit photons. Quantum dots are nano-structures that exhibit various properties, such as light generation, based on quantum mechanical effects. Quantum Wells are two-dimensional structures formed by a thin layer of a first material surrounded by wider-bandgap material and that only allow electronic capture in one dimension (allowing planar two-dimensional movement). In contrast, Quantum Dots act as zero-dimensional entities that are embedded in the waveguide layer 170, which enables three-dimensional capture of excited electrons (not allowing movement), The Quantum Dots are surrounded by the waveguide layer 170 and are made of materials that have narrower bandgaps than the material of the waveguide layer 170. As will be appreciated, the precise size, shape, and material of the quantum dots will affect the color produced by the laser.

The contact layer 190 is made from a III-V semiconductor material, which in some (but not all) embodiments is the same III-V semiconductor material used in the base layer 140, but is doped differently than the base layer 140 to form an opposing semiconductor material. When the base layer 140 is p-doped, the contact layer 190 is n-doped and vice versa. The contact layer 190 forms the most distal layer from the wafer 110, and along with the base layer 140 surrounds the quantum dot layer 180, the waveguide layer 170, and the matrix layer 160. When sufficient voltage is applied across the contact layer 190 and the base layer 140, a current will flow through the quantum dot layer 180 and produce a laser beam.

As will be appreciated, various additional processes may be applied to etch the layers into a desired shape or profile, add one or more photonic elements, and/or process the QD laser, which are discussed in greater detail elsewhere in the present disclosure. Similarly, various wafer processes may be performed on the wafer 110 prior to or after bonding and/or growing the layers, such as, for example, the inclusion of through-silicon vias (TSV), alignment features, dicing the wafer 110 into individual components, etc., which are discussed in greater detail elsewhere in the present disclosure.

Figure 2:
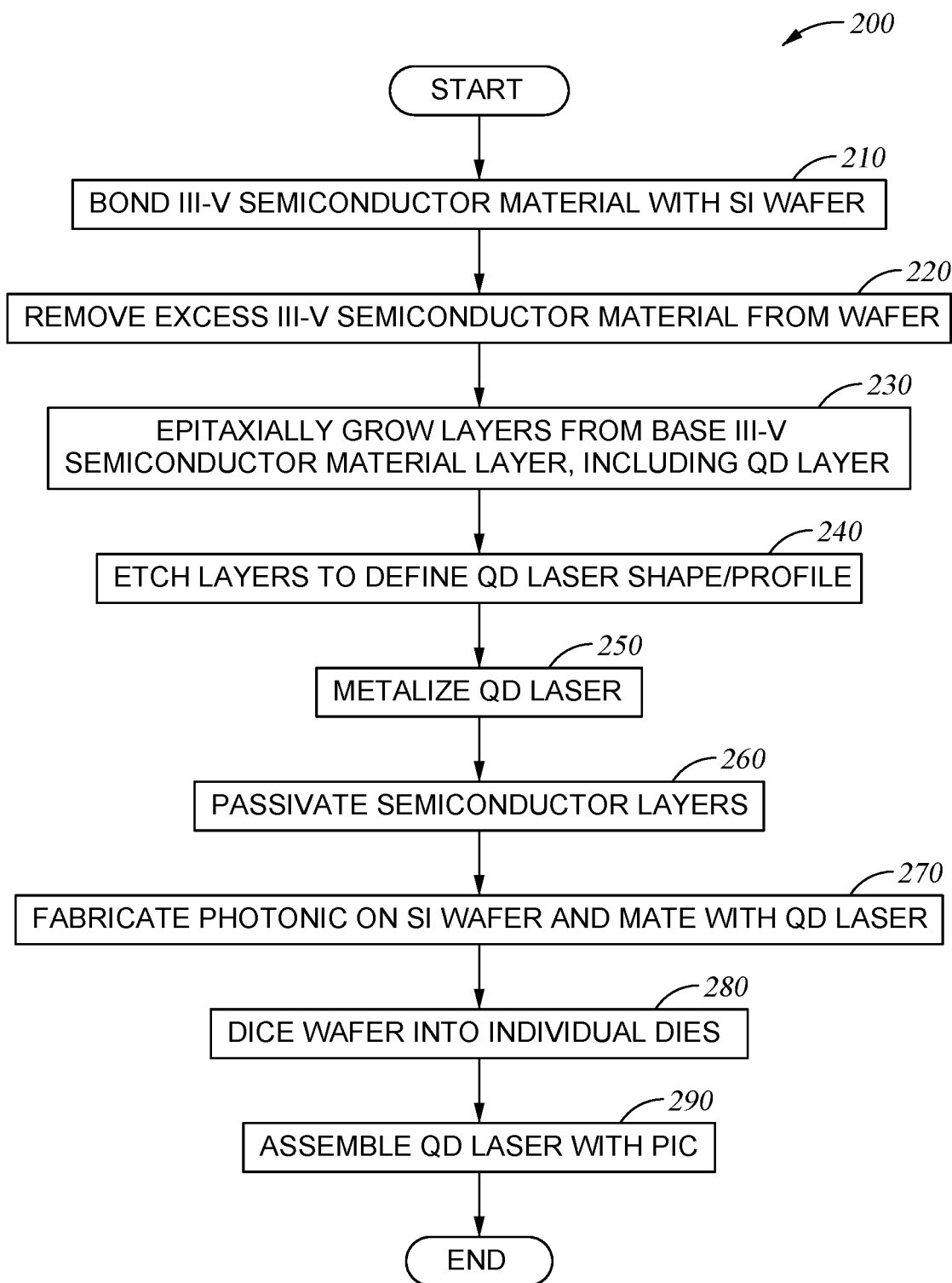
FIG. 2 illustrates a flow chart outlining general operations in an example method to produce the Quantum Dot laser assembly.

FIG. 2 illustrates a flow chart outlining general operations in an example method 200 to produce a QD laser assembly, according to one or more embodiments disclosed herein. Method 200 begins with OPERATION 210, where a III-V semiconductor material is bonded with a Si substrate. In some embodiments, the III-V semiconductor material is bonded directly to the Si substrate, while in other embodiments an intermediate bonding layer is used between the III-V semiconductor material and the Si substrate, such as in FIGS. 1C and 1D respectively.

Method 200 proceeds to OPERATION 220, where excess III-V semiconductor material is removed from the substrate to leave a thin film of III-V semiconductor material bonded with the Si substrate, such as is shown in FIG. 1E. In various embodiments, the thin film is doped with a first dopant material for use as an anode or as a cathode in a semiconductor device.

After the excess III-V semiconductor material is removed, at least one layer is epitaxially grown on the thin film of III-V semiconductor material at OPERATION 230, such as is shown in FIG. 1F. The at least one layer includes a layer of quantum dots, and may also include layers of a material that is lattice matched with the III-V semiconductor material of the thin film, layers of a III-V semiconductor material that form a waveguide for the quantum dots, and a second layer of a III-V semiconductor material doped with a second dopant material for use as a cathode (when the thin film is an anode) or as an anode (when the thin film is a cathode).

At OPERATION 240, the layers are etched to produce a predetermined profile or shape for the laser being fabricated. Etching to remove material from the grown layers may be done using chemical means, mechanical means, or a combination thereof according to various embodiments. Various steps of etching are illustrated and discussed in greater detail in regards to FIGS. 4A-D.

In some embodiments, etching is also applied to the Si substrate to produce various assembly features, although the Si substrate may be etched separately from the layers; either before or after the layers are etched. One example of an assembly feature is a through-silicon via (TSV), which defines a through-hole in the Si substrate and through which an electric contact is run the underside of the Si substrate to one or more layers grown on the top side of the Si substrate. A second example of an assembly feature is an alignment feature defined on the underside of the Si substrate, which allows for integrated circuit masks to be applied consistently to the to the Si substrate in relation to the layers on the opposite side, and for the mechanical positioning or manipulation of the component, among other benefits.

Metallization occurs at OPERATION 250, where electrical contacts made from a metallic conductor (e.g., gold, silver, copper, platinum) are attached to the Si substrate and various layers of the laser so that a current will flow between the contacts through the QD layer to produce a laser beam when an appropriate voltage is applied to the electrical contacts. FIGS. 4A-D illustrate example electrical contacts positioned relative to the example layers, and the related discussion covers the metallization process in greater detail.

Proceeding to OPERATION 260, the layers of the laser assembly are passivated to protect them from corrosion, stray voltages, stray contaminants, and/or to avoid or distribute mechanical stresses. In various embodiments, a layer of Silicon Dioxide ($SiO_2$) is applied to the layers for passivation. The passivation coating may be grown from the Si substrate and layers, deposited thereon, or a combination of initial growth and subsequent deposition may be used.

At least one photonic element is fabricated onto the substrate of the assembly at OPERATION 270 using various standard etching, deposition, lithography, etc. steps. In various embodiments, the photonic element fabricated onto the Si substrate may be any one of the example photonic elements 370 illustrated in FIGS. 5A-D, or another photonic element known to one of ordinary skill in the art. How an individual photonic element is fabricated onto the Si substrate may vary in different embodiments based on the materials of the photonic element, the size/shape of the photonic element, and its intended use profile. One of ordinary skill in the art will be familiar with various schemes for fabricating a photonic element onto a Si substrate.

The Si substrate is diced into individual components at OPERATION 280. As will be appreciated, several components are fabricated on one substrate (e.g., a wafer 110) that are separated from one another to produce several individual copies of the component (e.g., dies). Dicing may be done via a mechanical saw or laser cutting, and may involve several machines to separate the dies from one another or leftover portions of the substrate.

Various tests may be performed at the wafer level prior to dicing the wafer 110 into the individual dies. Example tests include, but are not limited to: device burn-in, wavelength characterization, light-current-voltage characterization, threshold measurements, wafer maps, photoluminescence, process monitoring, physical dimensions, etc.

Proceeding to OPERATION 290, individual dies, including the laser and any photonic elements bonded with one Si substrate may be mounted to another integrated circuit. Examples of other integrated circuits, and various schemes of mounting the assembly thereto are discussed in greater detail in regard to FIGS. 6A-C.

Method 200 may then conclude.

Figure 3A:
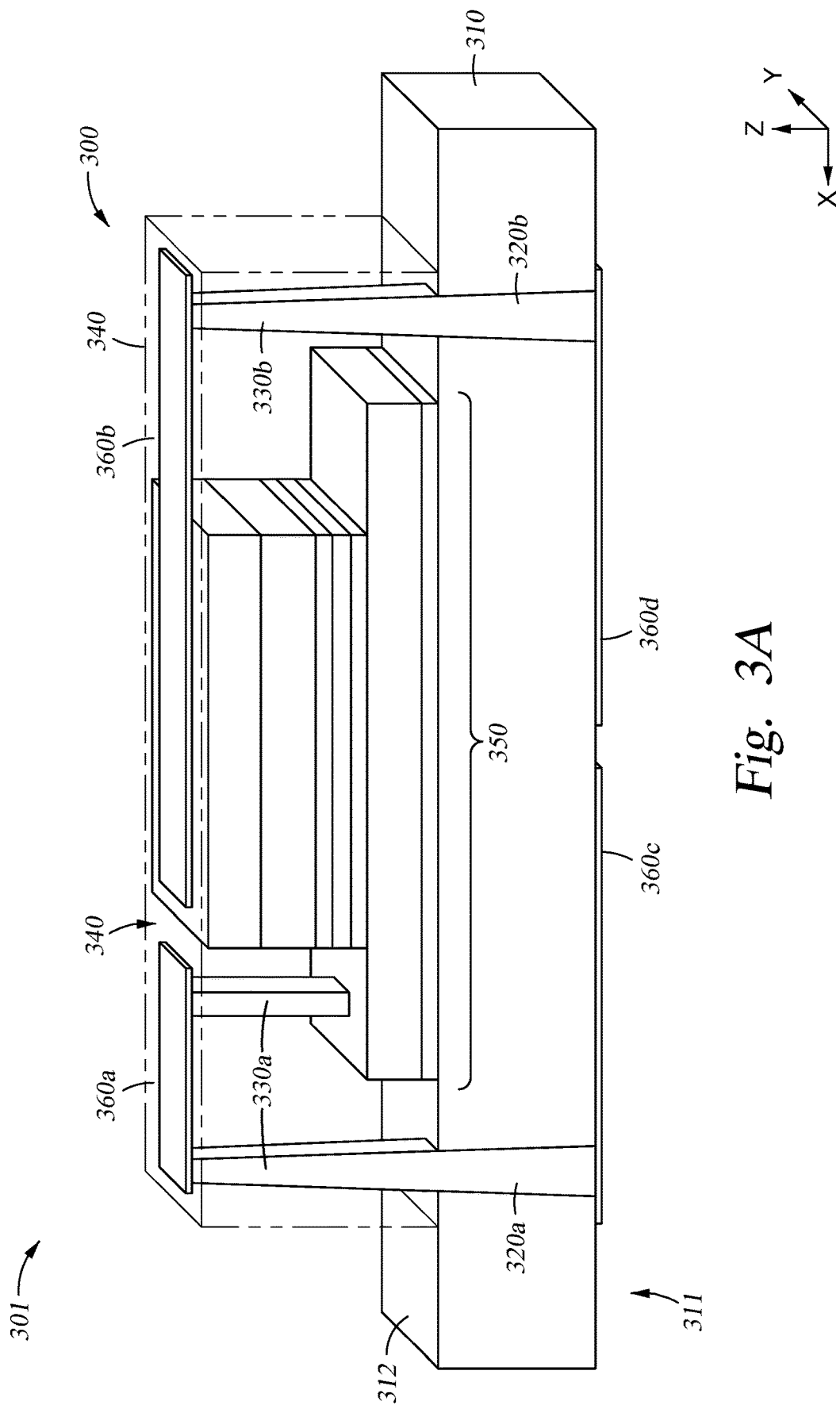

FIGS. 3A-C illustrate various views of an individual die of a QD laser produced according to one or more embodiments disclosed herein.

FIG. 3A illustrates a top-frontal isometric cutaway view 301 of the internal layering of a QD laser submount 300. The QD laser submount 300 is a discrete semiconductor component, which may include one or more pre-fabricated optical components (e.g., photonic elements 370) that are co-bonded with the substrate for use as part of a larger photonic circuit (discussed in greater detail in regards to FIGS. 6A-C) or as a discrete lasing component.

As illustrated, a first TSV 320a and a second TSV 320b (collectively or generically, TSV 320) extend from a bottom surface 311 of the substrate 310 to an upper surface 312 of the substrate 310. The dielectric 340 and the semiconductor layers 350 of the QD laser are bonded to the upper surface 312. In some embodiments, the TSVs 320 also extend through the dielectric 340. In some embodiments, the dielectric 340 comprises a silicon oxynitride (SiON) material, although other material(s) are also possible. As will be appreciated, the semiconductor layers 350 include the base layer 140, the matrix layer 160, the waveguide layer 170, the QD layer 180, and the contact layer 190. In some embodiments, the QD layer 180 within the semiconductor layers 350 relative to the upper surface 312 of the substrate 310 is formed at a predefined height so that the QD layer 180 can be aligned with any optical components that are bonded with the substrate 310 and/or that the QD laser submount 300 is mated with by using the upper surface 312 as a reference surface for the optical components.

A first electrical lead 330a and a second electrical lead 330b (collectively or generically, electrical leads 330) extend, respectively, from the first TSV 320a and the second TSV 320b to various layers of the semiconductor layers 350. The electrical leads 330 are held within the dielectric 340 used to passivate the QD semiconductor layers 350, and make contact with various layers of the semiconductor layers 350 (e.g., base layer 140, matrix layer 160, contact layer 190) to form a voltage pathway running through the QD layer 180 thereof. As illustrated, the electrical leads 330 extend electrical communication to the semiconductor layers 350 from contacts made outside of the substrate 310 via pads 360a-d (collectively, pads 360) that provide areas onto which wires or other components may be soldered, brazed, welded or otherwise affixed to the pads 360. Although four pads 360a-d are illustrated, with two pads 360a-b under the substrate 310 and two pads 360c-d above the semiconductor layers 350, more or fewer pads 360 may be used in other embodiments.

FIG. 3B illustrates a top-lateral isometric view 302 of the QD laser submount 300 with a photonic element 370 shown fabricated in the upper surface 312 (covered in FIG. 3B by the photonic element 370 and the semiconductor layers 350) of the substrate 310 and optically aligned with the QD layer 180. Although one photonic element 370 is shown fabricated on the substrate 310, more or fewer photonic elements 370 may be fabricated on the substrate 310 to mate with the QD layer 180 in other embodiments. For example, a QD laser submount 300 may be completed without a photonic element 370. In another example, a photonic element 370 may be fabricated either side of the semiconductor layer 350 and optically aligned with the QD layer 180. Various examples of photonic elements 370 are discussed in greater detail in regard to FIGS. 5A-D.

The photonic element 370 is aligned so that any waveguides defined in the photonic element 370 will be optically aligned with the QD layer 180 according to the predetermined height relative to the substrate at which the QD layer 180 is grown. In various embodiments, the photonic element 370 is fabricated directly on the substrate 310, or indirectly on the substrate 310 (e.g., via the intermediate layer 130). Additionally, in some embodiments the photonic element 370 is also encased in the dielectric 140, while in other embodiments, the photonic element 370 is outside of the dielectric 340.

FIG. 3C illustrates a bottom-lateral isometric view 303 of the QD laser submount 300 with various assembly features shown on the bottom surface 311 of the substrate 310. The assembly features are constructed on the wafer 110 prior to dicing the wafer 110 into individual dies, but each assembly feature is associated with one die. As shown on the die illustrated in FIG. 3C, three pads 360 (associated with TSV 320) are shown, three raised alignment features 380 are shown (raised relative to the bottom surface 311), and two etched alignment features 380 are shown (etched into the bottom surface 311). The alignment features 380 include, but are not limited to: fiducial markers for optical imaging systems (e.g., sets of two to three alignment dots in known positions), mechanical stops, metalized marks, poke-yoke features (e.g., go/no-go features for later assembly), epoxy slots, and other identifying features such as crosshairs, QR codes, and component callouts/labels FIGS. 4A-D illustrate various frontal cut-away views to highlight the different layers and strata of a QD laser in various stages of fabrication, according to one or more embodiments disclosed herein.

FIG. 4A illustrates a view 401 of the stratified layers of a QD laser prior to etching. As illustrated, from bottom to top, a silicon stratum 111 is bonded with a first III-V semiconductor material stratum 141, from which a first cladding stratum 161, a first waveguide stratum 171, a quantum dot stratum 181, a second waveguide stratum 172, a second cladding stratum 162, and a second III-V semiconductor material stratum 191 are epitaxially grown. As will be appreciated, the relative heights of the individual strata may vary in different embodiments. The quantum dot stratum 181 is positioned at a predetermined height relative to an upper surface 312 of the silicon stratum 111 to allow for alignment with pre-made photonic elements 370 that are fabricated on the upper surface 312 of the surface stratum 111.

FIG. 4B illustrates a view 402 of one example of an etched QD laser. Etching removes material from one or more layers of the semiconductors of the QD laser to produce a tiered set of layers according to a predefined shape or profile for the semiconductor components of the QD laser. In some embodiments, such as the example illustrated in FIG. 4B, the contact layer 190, waveguide layer 180, QD layer 170, and matrix layer 160 are etched, although more or fewer layers may be etched in other embodiments. As shown in FIG. 4B, the first III-V semiconductor material stratum 141 has a wider cross-section that the "higher" strata, which allows for electrical leads 330 to make contact with the first III-V semiconductor material stratum 141, the first cladding stratum 161, and/or the contact stratum 191, and to be insulated from the other strata to which they are not to make contact with.

Figures 4C, 4D:
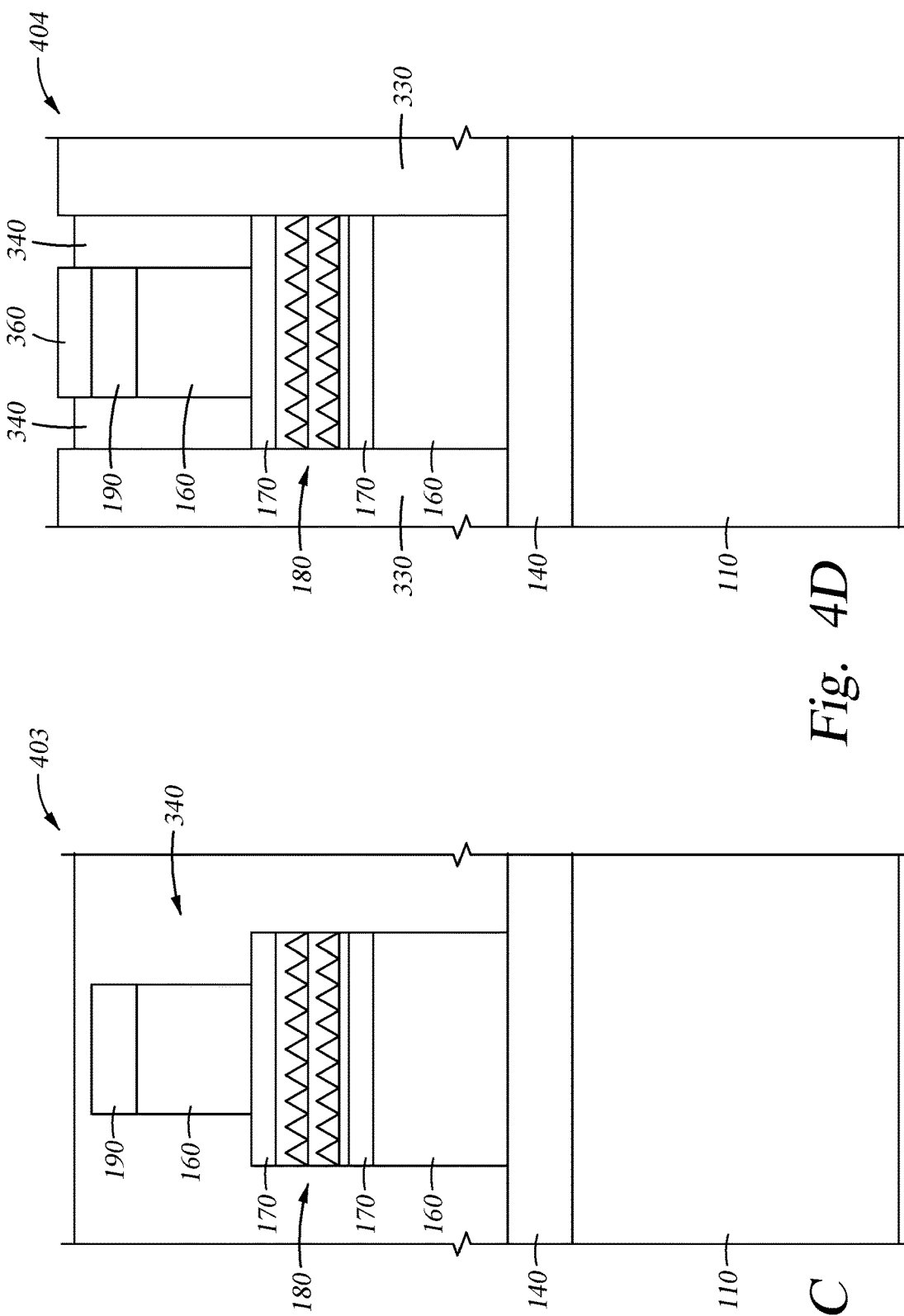

FIG. 4C illustrates a view 403 of one example of the etched QD laser that has been passivated. A dielectric 340, such as $SiO_2$ or SiON, is applied to the etched layers to protect those layers from corrosion, physical damage, electrically insulate the layers, and/or to provide a desired shape for the QD laser. The dielectric 340 may be applied in one or more stages in various embodiments.

FIG. 4D illustrates a view 404 of one example of the etched and passivated QD laser that has been metalized. Metallization may be achieved via evaporation or sputtering processes so as to add TSVs 320, electrical leads 330 and pads 360 for the QD laser. The electrical leads 330 may pass through the dielectric 340 and terminate in one or more pads 360. The pads 360 are positioned on one or more of the bottom surface 311 of the silicon stratum 111, above an upper side of the dielectric 340, or on top of the second III-V stratum 191 so that other components can be physically attached to and/or electrically connected to the QD laser. As shown, the electrical leads 330 are out of the beam path of the laser produced by QD layer 180.

FIGS. 5A-D illustrate various example photonic elements 370 integrated with the QD laser assemblies constructed according to the present disclosure. In each of the illustrated examples of FIGS. 5A-D, the example photonic elements 370 are integrated in a QD laser submount 300 with the substrate 310 and the semiconductor layers 350 of the QD laser. The photonic element 370 is fabricated on the substrate 310 and mated to the semiconductor layers 350. Any waveguides internal to the photonic element 370 are aligned with the waveguide layer 170 and the quantum dot layer 180 of the semiconductor layers 350. In various embodiments, different surface treatments are applied to the face of the photonic element 370 mated to the semiconductor layers 350 to affect the reflectivity of the face of the photonic element 370.

Figure 5A:
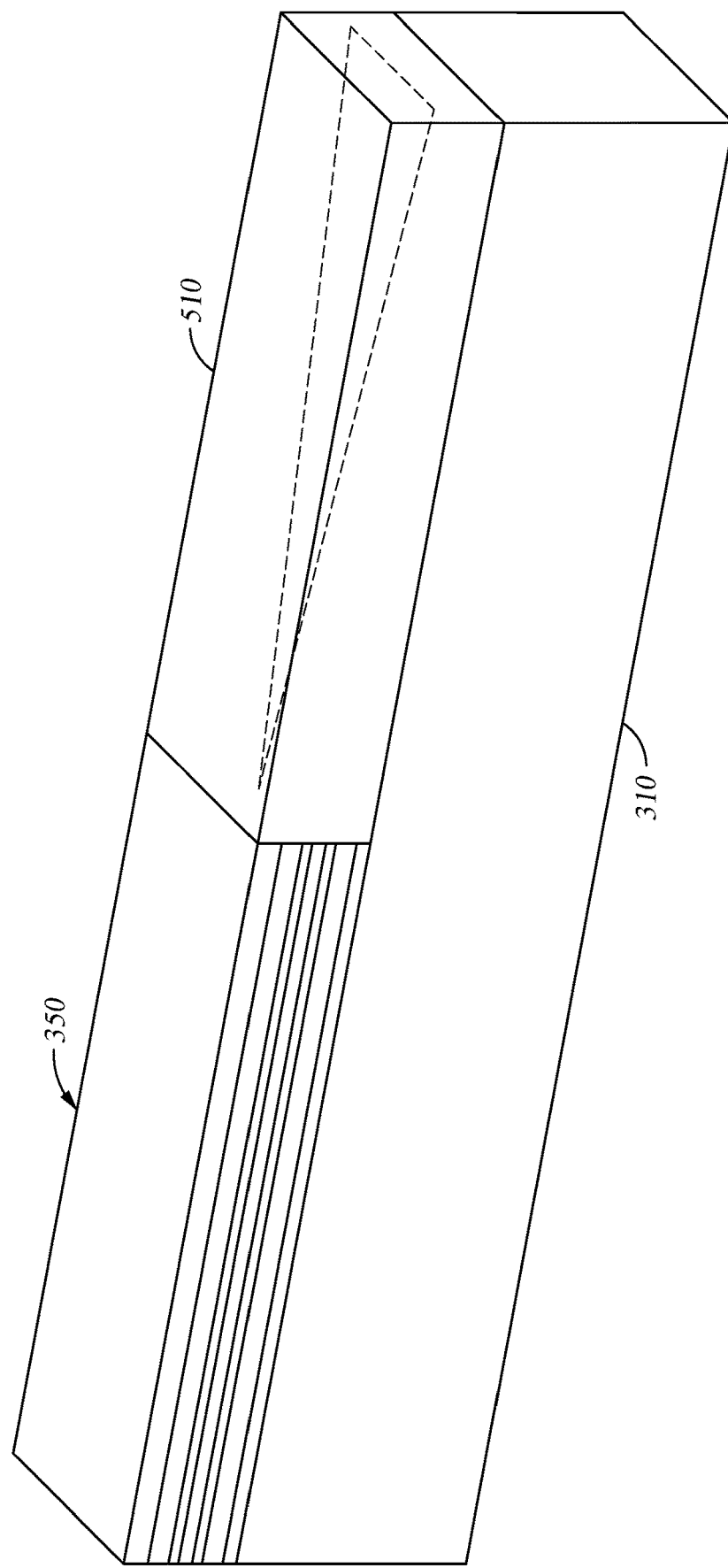
FIGS. 5A-D illustrate various example photonic elements integrated with the Quantum Dot laser assemblies constructed according to the present disclosure.
Figure 5B:
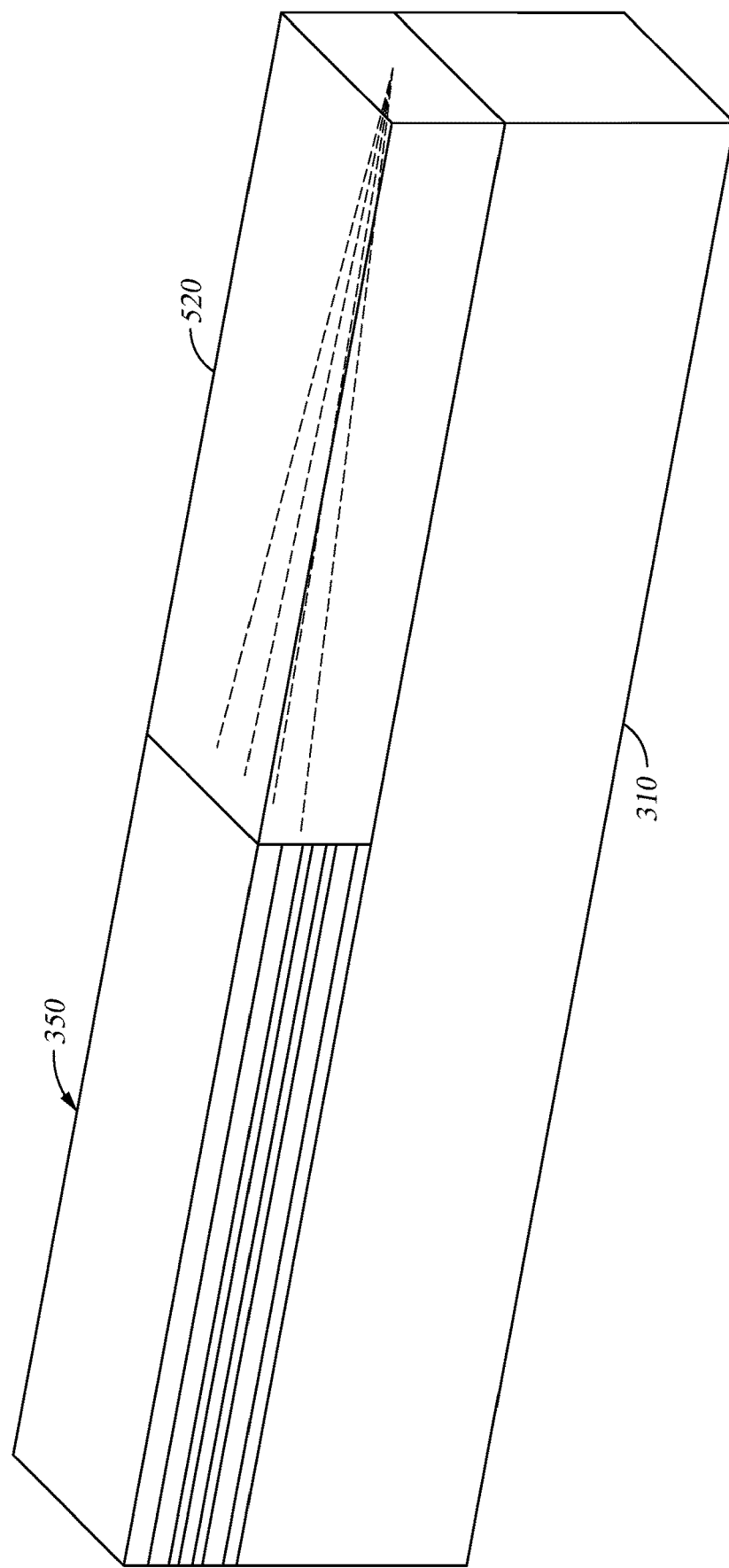
Figure 5C:
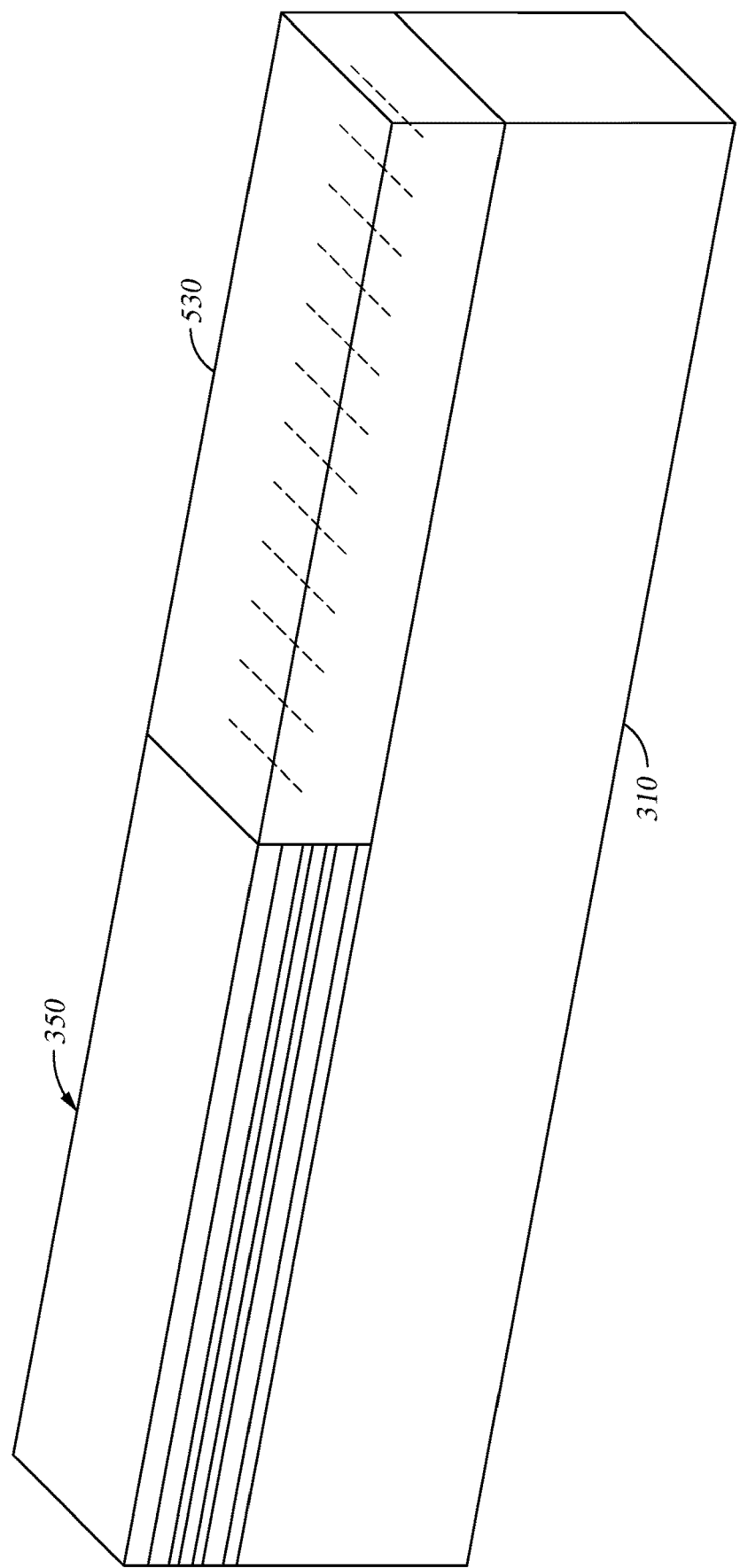

FIG. 5A shows a mode converter photonic element 510 as an example photonic element 370 that spreads the propagating frequency of the laser beam. FIG. 5B shows a wavelength combiner/splitter photonic element 520 as an example photonic element 370, which combines or splits the laser beam based on its wavelengths. FIG. 5C shows a feedback photonic element 530 as an example photonic element 370, (such as a distributed Bragg reflector), which produces various stopbands in the photonic element 370 to regulate the wavelengths of the laser beam that are emitted from the QD laser submount 300.

Figure 5D:
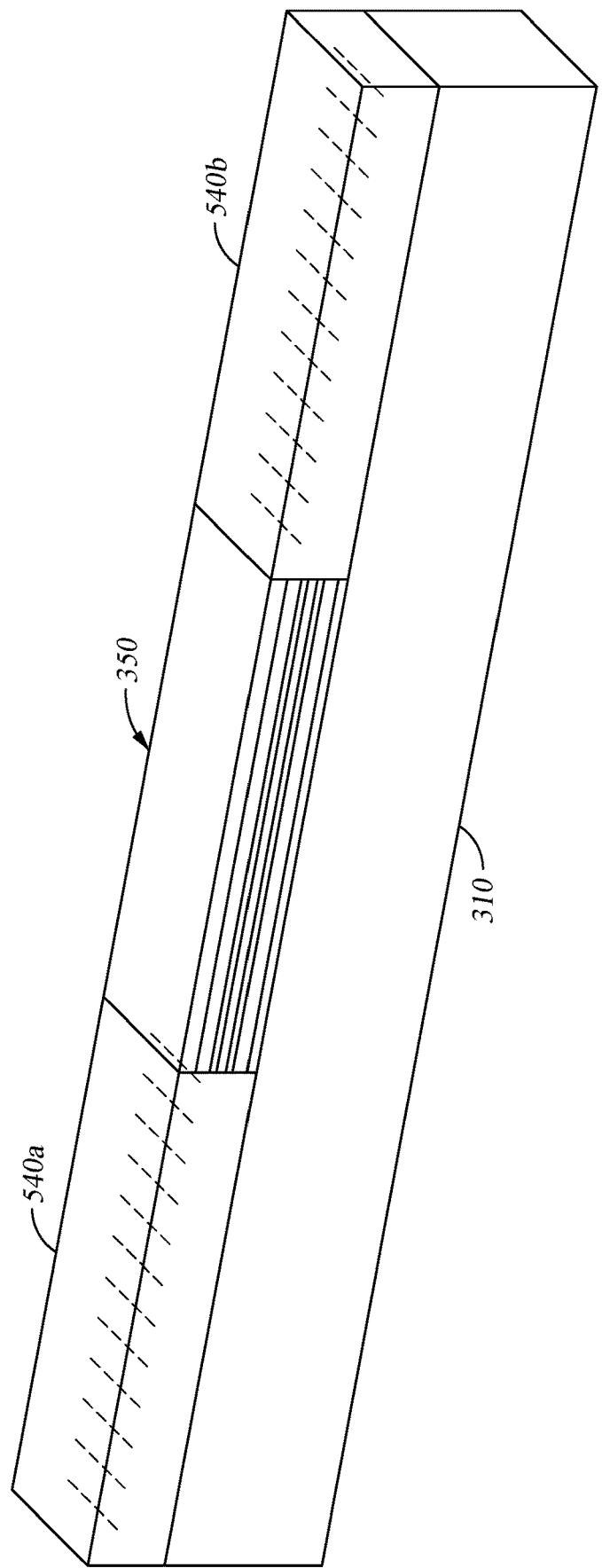

FIG. 5D shows a multi-photonic setup, including two photonic elements 540a-b as example photonic elements 370. In various embodiments, each of the two photonic elements 540a-b may be any of the photonic elements 510, 520, 530 described in relation to FIGS. 5A-C, although other photonic elements 370 are envisioned and the current disclosure is not limited to the examples shown in FIGS. 5A-C. Each of the two photonic elements 540a-b may be the same type of photonic element 510, 520, 530, or the first photonic element 540a may be a different type (e.g., a combiner/splitter photonic element 520) than the second photonic element 540b (e.g., a feedback photonic element 530). Additionally, in some embodiments, at least one face of the second photonic element 540b is given a highly reflective surface, to act as a reflector for the laser beam.

Figure 6C:
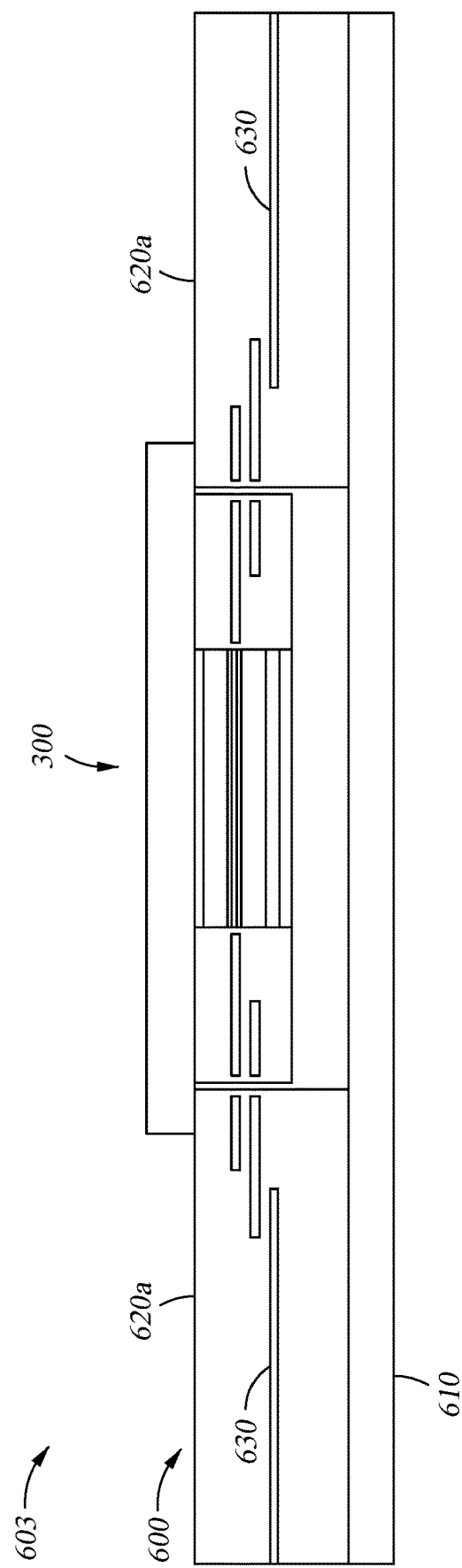

FIGS. 6A-C illustrate various mounting schemes for a QD laser with a larger photonic integrated circuit (PIC) 600, according to one or more embodiments disclosed herein. The PIC 600 in each of FIGS. 6A-C includes a PIC substrate 610 with which a first PIC photonic element 620a (generally, PIC photonic element 620) is fabricated optically aligned with the QD layer 180 of a mounted QD laser submount 300. A second PIC photonic element 620b is fabricated on the PIC substrate 610 opposite to the first PIC photonic element 620a relative to the mounted QD laser submount 300. In some embodiments, the second PIC photonic element 620b is a reflector that directs the beam generated by the mounted QD laser submount 300 back to the first PIC photonic element 620a. In other embodiments, the second PIC photonic element 620b directs an externally generated beam into the QD layer 180 for amplification or detection. In yet other embodiments, the second PIC photonic element 620b may be omitted if the QD laser submount 300 incorporates a second photonic element 370 that is a reflector.

In various embodiments, two separate PIC photonic elements 620 are fabricated a predetermined distance from one another on the PIC substrate 610 to define a pocket in which the QD laser submount 300 is to be mounted. In other embodiments, a single PIC photonic element 620 is bonded with the PIC substrate 610 and is etched to produce the pocket and thereby differentiate the first PIC photonic element 620a from the second PIC photonic element 620b.

The height of the PIC photonic elements 620 is defined so that the waveguide layer 170 and QD layer 180 of a mounted QD laser submount 300 will be aligned with PIC waveguides 630 defined in the PIC photonic elements 620. Although one PIC waveguide 630 is illustrated in FIGS. 6A-C, various PIC waveguides 630 may be included within the PIC photonic elements 620. In various embodiments the submount 300 is optically coupled to the PIC 600 using various approaches and coupling elements, including, but not limited to: mode converters, edge-coupling, evanescent coupling, gratings, turning mirrors, etc.

FIG. 6A illustrates a first mounting scheme 601 in which the QD laser submount 300 is mounted in place within the pocket of the PIC 600 with an epoxy 640 (including various glues, cements, and adhesives) between the shoulders of the substrate 310 of the QD laser submount 300 and the PIC photonic elements 620. Wires 650 are then bonded to pads 360 defined on the bottom surface 311 (facing upward in FIG. 6A) of the substrate 310 to establish electrical connections to the QD laser submount 300. In the illustrated configuration of FIG. 6A, the face of the first PIC photonic element 620a coupled with the QD laser submount 300 includes an anti-reflective surface treatment, whereas the second PIC photonic element 620b includes a highly-reflective surface treatment on the face coupled with the QD laser submount 300. In various embodiments, the surface treatments applied to the PIC photonic elements 620 is between about 2 micrometers (μm) and about 15 μm thick, which is significantly thinner than the surface treatments used in InP QW laser PICs.

FIG. 6B illustrates a second mounting scheme 602 in which the QD laser submount 300 is mounted in place within the pocket of the PIC 600 via solder collapse between the top side of the QD laser submount 300 and the upper surface of the PIC substrate 610. When using the second mounting scheme 602, the QD laser submount 300 may omit TSVs 320 and metallization on the bottom surface 311 of the substrate 310, as the electrical connections to the QD laser submount 300 are made through the solder 660 and metallization of the PIC substrate 610, such as through one or more PIC TSV 670 and/or PIC Pad 680. In the illustrated configuration of FIG. 6B, the face of the first PIC photonic element 620a coupled with the QD laser submount 300 includes an anti-reflective surface treatment, whereas the second PIC photonic element 620b includes a highly-reflective surface treatment on the face coupled with the QD laser submount 300.

FIG. 6C illustrates a third mounting scheme 603 in which the QD laser submount 300 operates as a semiconductor optical amplifier (SOA) between two PIC photonic elements 620. In the illustrated configuration of FIG. 6C, the face of the first PIC photonic element 620a coupled with the QD laser submount 300 and the face of the second PIC photonic element 620b coupled with the QD laser submount 300 both include an anti-reflective surface treatment and a PIC waveguide 630. In other embodiments, one face of the second photonic element 370b or the second PIC photonic element 620b is made highly reflective, thus forming a reflective semiconductor optical amplifier (RSOA).

Figure 7A:
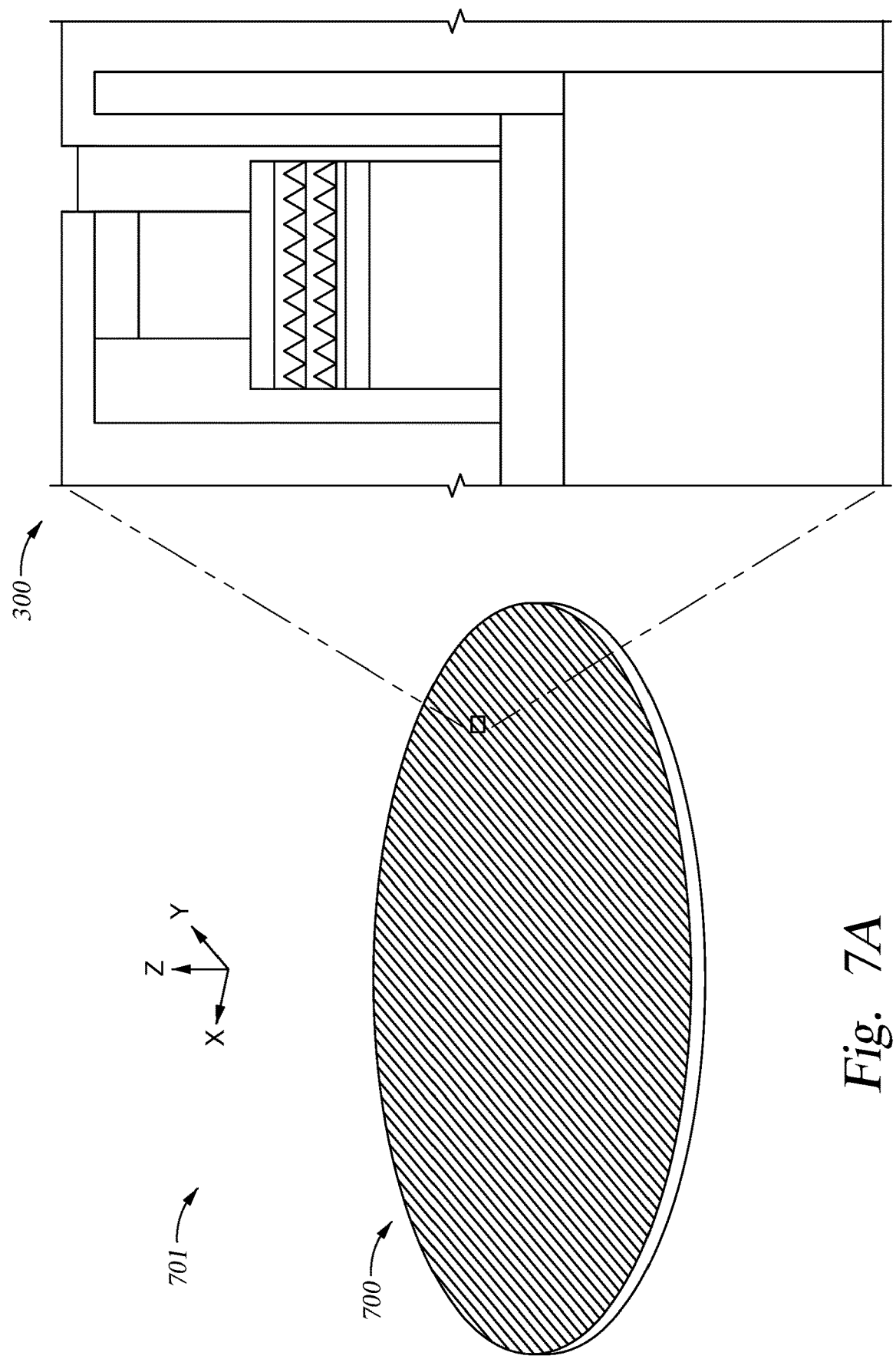
FIGS. 7A & 7B illustrate wafer-level views of the Quantum Dot lasers fabricated according to the present disclosure.
Figure 7B:
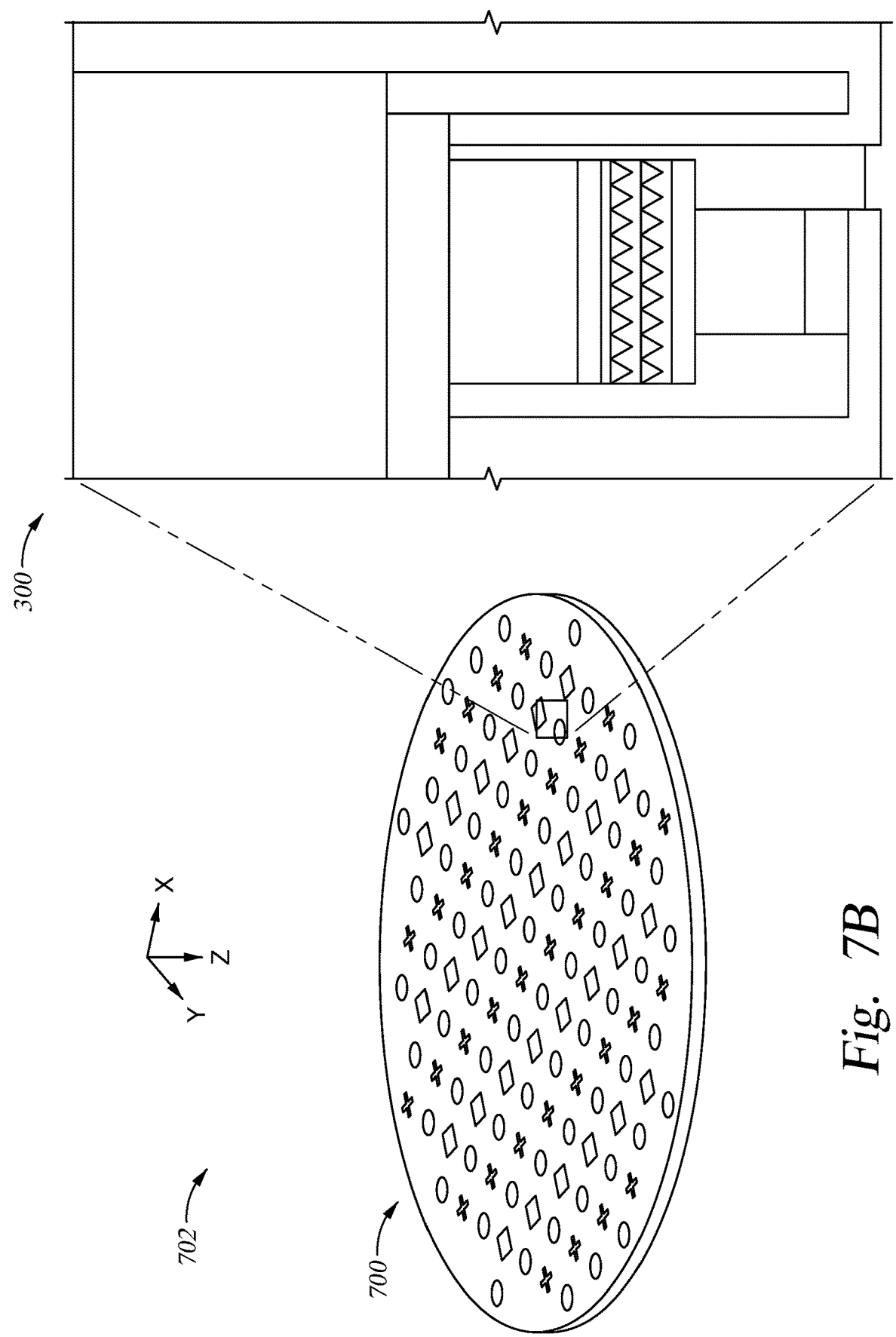

FIGS. 7A & 7B illustrate wafer-level views of the QD lasers fabricated according to the present disclosure. FIG. 7A illustrates a top-view 701 of a populated wafer 700, and FIG. 7B illustrates a bottom-view 702 of the populated wafer 700. The top-view 701 shows a plurality of QD laser submounts 300 (with integrated photonic elements 370) as individual dies on the populated wafer 700. The bottom-view 702 shows a plurality of assembly features (e.g., TSV 320 and alignment features 380) that are associated with the individual dies of the QD submounts 300 on the opposing side of the populated wafer 700.

As will be appreciated, the populated wafer 700 will be diced into individual dies for use as QD laser submounts 300. Prior to dicing the populated wafer 700 however, various tests may be performed on the individual dies on the populated wafer 700 to determine whether the dies have been properly fabricated. Such tests include, but are not limited to: device burn-in, wavelength characterization, light-current-voltage characterization, threshold measurements, wafer maps, photoluminescence, process monitoring, physical dimensions, etc.

Embodiments of the present disclosure are described with reference to flowchart illustrations and/or block diagrams of methods, apparatus (systems) and computer program products according to embodiments presented in this disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable storage medium that can direct a computer, other programmable data processing apparatus, or other devices to function in a particular manner, such that the instructions stored in the computer readable storage medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality and operation of possible implementations of systems, methods, and computer program products according to various embodiments. In this regard, each block in the flowchart or block diagrams may represent a module, segment or portion of code, which comprises one or more executable instructions for implementing the specified logical function(s). It should also be noted that, in some other implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In view of the foregoing, the scope of the present disclosure is determined by the claims that follow.

We claim:

1. A method, comprising:
   bonding a sheet of a III-V semiconductor material that is pre-doped with a first dopant with a first side of a silicon wafer;
   removing excess III-V semiconductor material bonded with the silicon wafer to leave a base layer of a predetermined thickness of the III-V semiconductor material bonded with the silicon wafer;
   epitaxially growing at least one layer on the base layer, the at least one layer comprising a quantum dot layer arranged with a predetermined height relative to the first side of the silicon wafer; and
   dicing the silicon wafer to produce a plurality of quantum dot lasers.

2. The method of claim 1, further comprising:

adding a plurality of alignment features to a second side of the silicon wafer opposite to the first side; and wherein dicing the silicon wafer produces the plurality of quantum dot lasers such that each quantum dot laser includes at least one alignment feature of the plurality of alignment features.

3. The method of claim 2, wherein alignment features include at least one of:

fiducial markers;

Mechanical stops; and metalized marks.

4. The method of claim 1, further comprising:

adding a plurality of through-silicon vias to the wafer, wherein each through-silicon via extends between the first side and an opposite second side of the silicon wafer; and wherein dicing the silicon wafer produces the plurality of quantum dot lasers such that each quantum dot laser includes at least two through-silicon vias of the plurality of through-silicon vias.

5. The method of claim 4, further comprising:

attaching electrical contacts through each through-silicon vias of the at least two through-silicon vias to an associated quantum dot laser of the plurality of quantum dot lasers; and wherein a voltage path for the associated quantum dot laser that runs through the quantum dot layer is defined between the electrical contacts.

6. The method of claim 1, further comprising:

prior to dicing, etching each quantum dot laser of the plurality of quantum dot lasers into a predetermined shape.

7. The method of claim 6, further comprising:

after etching and prior to dicing, encasing each quantum dot laser of the plurality of quantum dot lasers with a dielectric.

8. The method of claim 6, further comprising:

after etching and prior to dicing, fabricating a photonic on the silicon substrate for each quantum dot laser of the plurality of quantum dot lasers.

9. The method of claim 1, further comprising:

mounting each quantum dot laser of the plurality of quantum dot lasers to a Silicon Integrated Circuit that includes an integrated photonic element.

* * * * *